(12) United States Patent  (10) Patent No.: US 7,584,009 B2
Andersen et al.  (45) Date of Patent: Sep. 1, 2009

(54) MULTI-CHIP PWM SYNCHRONIZATION AND COMMUNICATION

(75) Inventors: Jack B. Andersen, Austin, TX (US); Daniel L. W. Chieng, Austin, TX (US); Michael A. Kost, Austin, TX (US); Jan A. Larson, Austin, TX (US)

(73) Assignee: D2Audio Corporation, Milpitas, CA (US)

( * ) Notice: Subject to any disclaimer, the term of this patent is extended or adjusted under 35 U.S.C. 154(b) by 709 days.

(21) Appl. No.: 10/805,593

(22) Filed: Mar. 19, 2004

(65) Prior Publication Data

US 2004/0186602 A1  Sep. 23, 2004

Related U.S. Application Data

(60) Provisional application No. 60/469,734, filed on May 12, 2003, provisional application No. 60/456,414, filed on Mar. 21, 2003, provisional application No. 60/456,430, filed on Mar. 21, 2003, provisional application No. 60/456,429, filed on Mar. 21, 2003, provisional application No. 60/456,421, filed on Mar. 21, 2003, provisional application No. 60/456,422, filed on Mar. 21, 2003, provisional application No. 60/456,428, filed on Mar. 21, 2003, provisional application No. 60/456,420, filed on Mar. 21, 2003, provisional application No. 60/456,427, filed on Mar. 21, 2003.

(51) Int. Cl.
*G06F 17/00* (2006.01)
(52) U.S. Cl. .......................... 700/94; 381/120
(58) Field of Classification Search ......... 709/208–211; 710/61, 110; 712/31; 700/94
See application file for complete search history.

(56) References Cited

U.S. PATENT DOCUMENTS

| 4,598,399 | A |   | 7/1986  | Bath            |         |
|-----------|---|---|---------|-----------------|---------|
| 5,822,779 | A | * | 10/1998 | Intrater et al. | 711/168 |
| 5,875,250 | A | * | 2/1999  | Kuo et al.      | 381/120 |
| 5,907,482 | A | * | 5/1999  | Otake           | 363/41  |
| 6,429,737 | B1 |   | 8/2002 | O'Brien         |         |
| 6,639,956 | B1 | * | 10/2003 | Song           | 375/354 |

(Continued)

FOREIGN PATENT DOCUMENTS

EP  0353406 A1  2/1990

OTHER PUBLICATIONS

PC104 Audio Module, http://pc104.winsystems.com/products/pc104/pcmaudio.html.*

*Primary Examiner*—Walter F Briney, III
(74) *Attorney, Agent, or Firm*—Fliesler Meyer LLP

(57) ABSTRACT

Systems and methods for synchronizing multiple digital audio controller chips, wherein one of the chips is designated as a master and the other chips are designated as slaves. A common line connects all of the chips and is used to transmit synchronization signals from the master to the slaves. Each of the chips listens for an appropriate signal and, when the signal is detected, all of the chips simultaneously begin operation. In one embodiment, the synchronization signal comprises a transition on the shared line to an active state. The transition is repeated at fixed intervals and maintained in the active state for a fixed period in order to enable the chips to determine whether synchronization is being maintained. The signal may be sampled and/or filtered to improve reliability. The chips may be able to drive the shared line active to indicate that synchronization has been lost.

22 Claims, 3 Drawing Sheets

U.S. PATENT DOCUMENTS 6,731,162 B2 * 5/2004 Yeongha et al. ............... 330/10
6,799,234 B1 * 9/2004 Moon et al. ................. 710/110
6,854,053 B2 * 2/2005 Burkhardt et al. .............. 713/2
2002/0098812 A1 7/2002 Sourour et al.

* cited by examiner

MULTI-CHIP PWM SYNCHRONIZATION AND COMMUNICATION

RELATED APPLICATIONS

This application claims priority to: U.S. Provisional Patent Application No. 60/469,734, entitled "Multi-chip PWM with Staggered Outputs," by Jack B. Andersen, et al., filed May 12, 2003; U.S. Provisional Patent Application No. 60/456,414, entitled "Adaptive Anti-Clipping Protection," by Taylor, et al., filed Mar. 21, 2003; U.S. Provisional Patent Application No. 60/456,430, entitled "Frequency Response Correction," by Taylor, et al., filed Mar. 21, 2003; U.S. Provisional Patent Application No. 60/456,429, entitled "High-efficiency, High-Performance Sample Rate Converter," by Andersen, et al., filed Mar. 21, 2003; U.S. Provisional Patent Application No. 60/456,421, entitled "Output Device Switch Timing Correction," by Taylor, et al., filed Mar. 21, 2003; U.S. Provisional Patent Application No. 60/456,422, entitled "Output Filter, Phase Timing Correction," by Taylor, et al., filed Mar 21, 2003; U.S. Provisional Patent Application No. 60/456,428, entitled "Output Filter Speaker/Load Compensation," by Taylor,et al., filed Mar. 21, 2003; U.S. Provisional Patent Application No. 60/456,420, entitled "Output Stage Channel Timing Calibration," by Taylor, et al., filed Mar. 21, 2003; U.S. Provisional Patent Application No. 60/456,427, entitled "Intelligent Over-Current, Over-Load Protection," by Hand, et al., filed Mar. 21, 2003; each of which is fully incorporated by reference as if set forth herein in its entirety.

BACKGROUND

1. Field of the Invention

The invention relates generally to audio amplification systems and more particularly to systems and methods for synchronizing and communicating between multiple chips, each of which contains one or more channels of an audio amplification system.

2. Related Art

Pulse Width Modulation (PWM) or Class D signal amplification technology has existed for a number of years. PWM technology has become more popular with the proliferation of Switched Mode Power Supplies (SMPS). Since this technology emerged, there has been an increased interest in applying PWM techniques in signal amplification applications as a result of the significant efficiency improvement that can be realized through the use of Class D power output topology instead of the legacy (linear Class AB) power output topology.

Early attempts to develop signal amplification applications utilized the same approach to amplification that was being used in the early SMPS. More particularly, these attempts utilized analog modulation schemes that resulted in very low performance applications. These applications were very complex and costly to implement. Consequently, these solutions were not widely accepted. Class D technology was therefore unable to displace legacy Class AB amplifiers in mainstream amplifier applications.

Recently, digital PWM modulation schemes have surfaced. These schemes use Sigma-Delta modulation techniques to generate the PWM signals used in the newer digital Class D implementations. These digital PWM schemes, however, did little to offset the major barriers to integration of PWM modulators into the total amplifier solution. Class D technology has therefore continued to be unable to displace legacy Class AB amplifiers in mainstream applications.

There are a number of problems with existing digital PWM modulation schemes. One of the problems is that audio system implementations are requiring increasing numbers of channels. For example, a home theater audio system may need to provide not only a single pair of stereo channels, but also a second pair of stereo channels (for a pair of front speakers and a pair of back speakers), as well as outputs for a center channel and for a sub-woofer speakers. Another example of a system that may require a large number of channels is a system which is intended to provide audio to a large area, such as multiple rooms within a building. Implementations such as these require more channels than are typically provided in a digital PWM system.

Existing digital PWM amplification systems only have as many channels as can be implemented on a single chip. Typically, these systems have either two or four channels. While it is possible to provide additional channels on a single chip, this typically is not a practical solution for several reasons. For example, there simply may not be enough space on the chip to implement the additional channels. It may also be possible that there are not enough resources (e.g., processor cycles) to process all of the channels on the same chip. Further, the complexity of the design may increase dramatically with the additional channels. Still further, even if a few additional channels could be accommodated, such a solution would not address the next generation of system requirements in which still more channels were required.

Existing digital PWM systems are not implemented across multiple chips because of difficulties that are associated with the interaction of multiple chips. One such difficulty may be the problem of synchronization. In order for the system to provide coherent control of all of the channels in the system, it is necessary to synchronize each of the chips so that they operate essentially as if the system were implemented on a single chip. No such mechanism currently exists for digital PWM audio amplification systems.

SUMMARY OF THE INVENTION

One or more of the problems outlined above may be solved by the various embodiments of the invention. Broadly speaking, the invention comprises systems and methods for enabling the use of multiple digital PWM chips in the same system to provide the additional channels and corresponding capabilities of which are required for many applications. In one embodiment, this is achieved by providing a mechanism through which multiple digital PWM chips can be synchronized. This enables the scaling of systems to provide as many channels as are necessary for any given application.

In one embodiment, a plurality of digital audio controllers are implemented on multiple chips. One of the chips is designated as a master, while the other chips are designated as slaves. A common synchronization line connects all of the chips and is used to transmit synchronization signals from the master to the slaves. When the master chip transmits an appropriate signal, all of the chips detect the signal and simultaneously begin synchronized operation. In this context, "synchronized operation" refers to the chips beginning to operate and doing so in a synchronized manner. It should be noted that other embodiments may also use this mechanism to time-align or phase align the outputs of chips that are already running.

In one embodiment, the master signals the slaves to begin operation by generating a transition on the shared line, and then repeats the transition at fixed intervals in order to enable the chips to determine whether synchronization is being maintained. The signal may also be maintained for a period of time and sampled and/or filtered to improve reliability. In one embodiment, one or more of the chips can assert a signal on the shared line to indicate that synchronization has been lost. In another embodiment, the chips can communicate over the shared line by transmitting data during periods when synchronization is not being checked. Numerous other features may also be implemented.

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
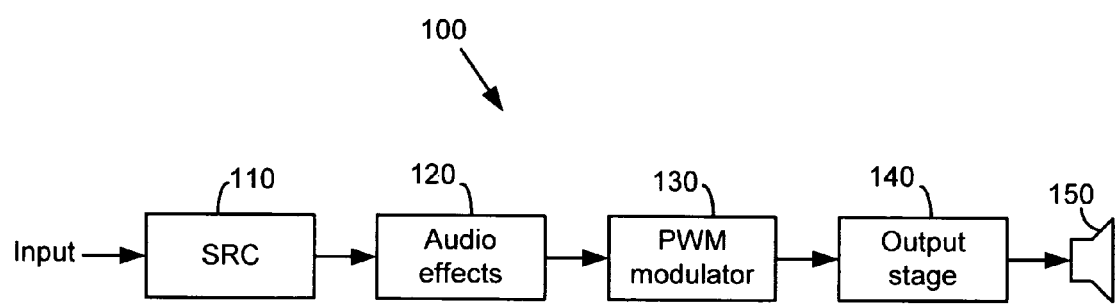
FIG. 1 is a functional block diagram illustrating a channel of a digital audio amplification system in accordance with one embodiment.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for synchronizing multiple digital audio controller chips (i.e., controllers implemented on different pieces of silicon, so that they cannot be internally synchronized). In one embodiment, one of the chips is designated as a master, while the other chips are designated as slaves. A common line connects all of the chips and is used to transmit synchronization signals from the master to the slaves. When the master chip transmits an appropriate signal, all of the chips simultaneously begin operation. As noted above, "synchronized operation" in this context refers to the chips beginning to operate and doing so in a synchronized manner, but other embodiments may use the same mechanism to time-align or phase align the outputs of chips that are already running.

In one embodiment, the master signals the slaves to begin operation by generating a transition on the shared line, and then repeats the transition at fixed intervals in order to enable the chips to determine whether synchronization is being maintained. The signal may also be maintained for a period of time and sampled and/or filtered to improve reliability. In one embodiment, one or more of the chips can assert a signal on the shared line to indicate that synchronization has been lost. In another embodiment, the chips can communicate over the shared line by transmitting data during periods when synchronization is not being checked. Numerous other features may also be implemented.

It should be noted that the description of the preferred embodiments that follows focuses on a digital, pulse width modulated (PWM) audio system. The invention is not, however, limited to PWM audio systems. Alternative embodiments of the invention may comprise other types of audio systems and possibly various types of systems that are implemented outside the realm of audio amplifiers.

As indicated above, it is desirable to be able to provide multiple channels in an audio amplification system through the use of multiple, synchronized chips. The synchronization enables control and alignment of the phases of the audio signals processed by each of the chips. Once the phases of the signals on the different chips are aligned, delays can be introduced in the audio channels to provide features such as noise reduction or audio effects.

Referring to FIG. 1, a functional block diagram illustrating a channel of a digital audio amplification system is shown. This embodiment is designed to convert a pulse code modulated (PCM) input data stream to a pulse width modulated (PWM) output data stream.

As depicted in FIG. 1, channel 100 receives a digital input data stream from a data source such as a CD player, MP3 player, digital audio tape, or the like. The input data stream is received by sample rate converter 110, which converts the data stream from a first sample rate to a second sample rate. The first sample rate depends upon the data source and is typically one of a set of predetermined sample rates that are used by the corresponding type of device. For example, a CD player may output digital data with a sample rate of 44.1 kHz, while a digital audio tape player may output data with a sample rate of 32 kHz. Sample rate converter 110 converts the data stream to a predetermined internal rate which is used within channel 100. In one embodiment, this internal sample rate is 100 kHz.

This internal data stream is then provided to an audio effects component 120. Audio effects component 120 performs any desired processing on the internal data stream and provides the resulting processed data stream to PWM modulator 130. The data stream received by PWM modulator 130 represents an amplitude modulated signal. PWM modulator 130 converts this data stream to a pulse width modulated signal. The pulse width modulated signal is then provided to output stage 140. In output stage 140 amplifies the pulse width modulated signal and may perform some filtering or further processing of the amplified signal. The resulting signal is then output to a speaker 150, which converts the electrical signal to an audible signal which can be heard by a listener.

Channel 100 is implemented in a single chip. It is common for two or even four channels to be implemented in the same chip. Each additional channel typically replicates the components of the first channel. As mentioned above, however, if it is necessary or desirable to provide more channels (e.g., eight, sixteen, or even more), it may be necessary to use multiple chips, each having several channels.

When a multi-channel PWM audio amplifier is based on multiple PWM audio controller chips, it is desirable to lock the output pulse phase of all controller chips together. This will enable several features. One of these features is the ability to match the phases of the audio outputs from each channel. In other words, the phase of each channel can be aligned. Another feature is the ability to shift the phases of the channels by known amounts to achieve desired effects. For example, once the phases of the channels are aligned, it is possible to shift the phase of each channel by a desired amount, so that the switching times of the channels are staggered. As a result, the switching of each channel will occur at a different time, so the noise that is generated on the power supply by the switching will be spread out.

Figure 2:
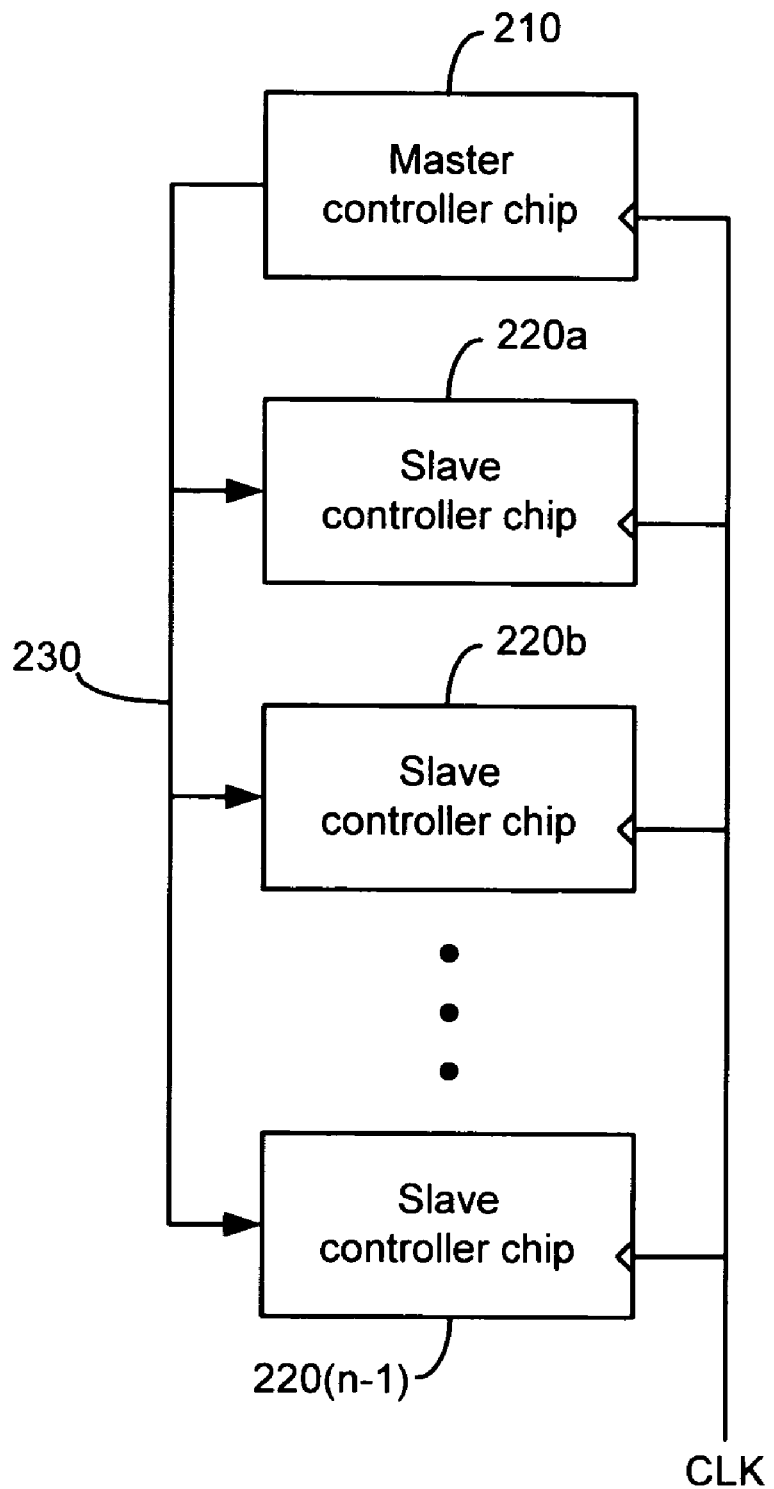
FIG. 2 is a diagram illustrating the master-slave relationship between the PWM controller chips in accordance with one embodiment.

In a multi chip system in accordance with one embodiment, one chip is the designated master and the other chips are slaves. the is illustrated in FIG. 2. FIG. 2 is a diagram illustrating the master-slave relationship between the PWM controller chips in one embodiment. While the figure depicts four controller chips, there may be n controller chips corresponding to m channels. One of the controller chips, 210, is a master. The remainder of the controller chips, 220, are slaves to master 210. The role of each chip is assigned when the chips are initialized. All of the chips run off a common clock source—either directly off a distributed high speed clock—or off a lower speed distributed clock using PLLs with a common multiplication factor.

It should be noted that, for the purposes of this disclosure, identical items in the figures may be indicated by identical reference numerals followed by a lowercase letter, e.g., 210a, 210b, and so on. The items may be collectively referred to herein simply by the reference numeral.

One wire 230 which is connected to each of the chips is used for synchronization. (Although the interconnect between the different chips is referred to herein as a "wire", it should be noted that any suitable type of interconnect can be used.) In one embodiment, the wire can be in one of two states: active or passive. The actual encoding (high/low) will depend on the particular implementation.

Figure 3:
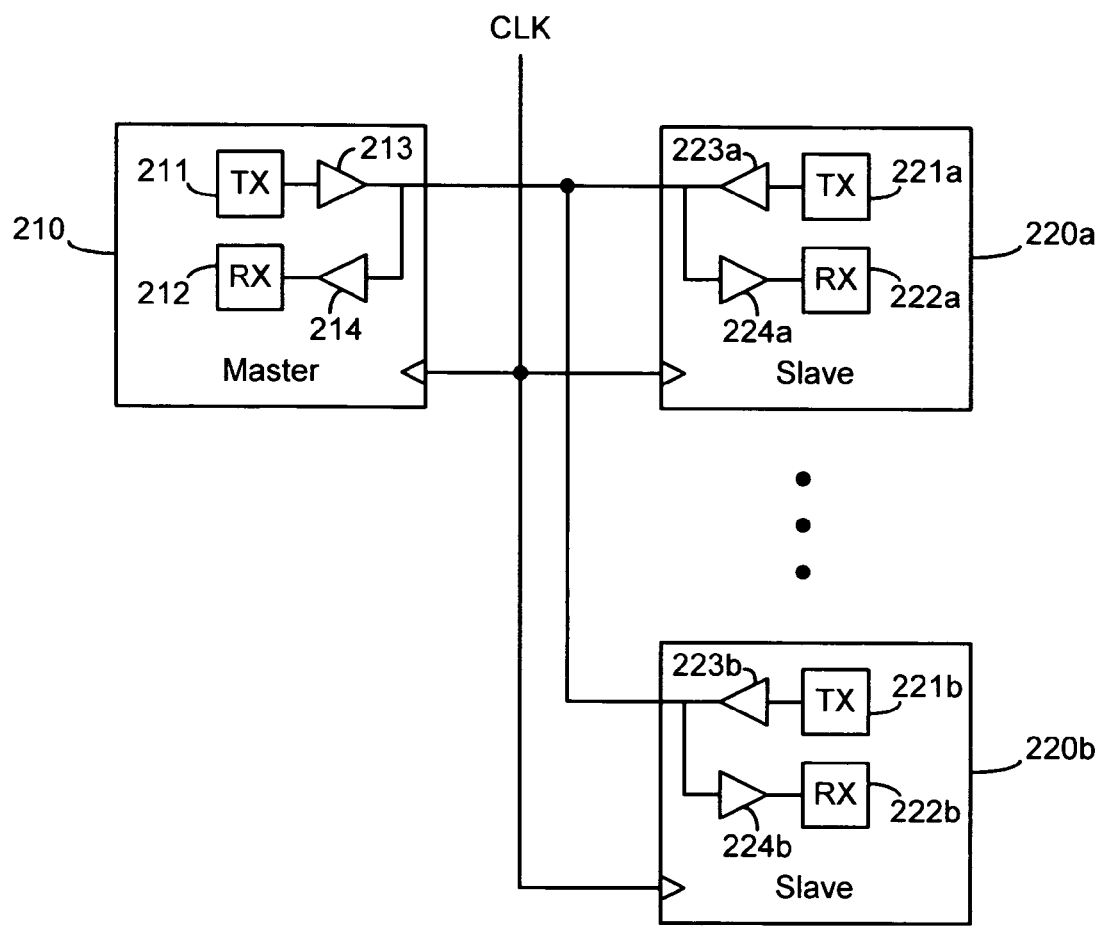
FIG. 3 is a diagram illustrating the connections between multiple chips in accordance with one embodiment.

Referring to FIG. 3, a diagram illustrating the connections between multiple chips is shown in more detail. In this figure, master controller chip 210 is coupled to each of a set of slave controller chips 220 via synchronization wire 230. A clock line is also coupled to each of the chips. Within the master chip, the synchronization wire is coupled to a transmit unit 211 and a receive unit 212 via corresponding drivers 213 and 214. Each of slave chips 220 is coupled to synchronization wire 230 in the same manner. The transmit and receive units are identified as items 221 and 222, respectively in the slave controller chips. The corresponding drivers are labeled as items 223 and 224.

When it is necessary for master controller chip 210 to communicate with slave chips 220, the appropriate signal is generated by transmit unit 211. The signal is driven onto synchronization wire 230 by driver 213. At each of the slave chips 220, the signal is amplified by driver 224 and forwarded to receive unit 222, from which is passed to the PWM engine of the controller chip. If it is necessary for one of slaves 220 to communicate with the master (or to cause all of the controller chips to lose synchronization), it does so in the same manner. In other words, a signal is generated by transmit unit 221 and driven onto synchronization wire 230 by driver 223. The signal is then received by the driver and receive unit of each of the controller chips.

It should be noted that, with respect to the synchronization of the controller chips, the transition signal indicating that the chips should start operating is received by all of the chips, including the master, in one embodiment. Thus, both the master and the slaves watch the synchronization wire for the transition. When the master sees the transition, it begins operation, just as the slaves do. The master and slaves may therefore be identically configured with respect to the way each other than begins synchronous operation.

After initialization, the master in a preferred embodiment assumes control of the wire and drives it into its passive state. All the chips (both master and slaves) then set up and prepare to run (generate audio). All chips (master and slaves) monitor the wire for a transition to the active state. The fact that all chips are ready to run can be ensured in one embodiment by waiting for a known time to start up. In another embodiment, the readiness of the chips can be communicated by other shared communication channels. In still other embodiments, other alternative mechanisms may be used. When all of the chips are ready, the master generates a transition to the active state on the wire. All of the chips then start up simultaneously when they detect the transition.

Ideally, once all of the chips are synchronized, they will remain synchronized. Often, however, error conditions can cause the chips to lose synchronization. Potential error conditions may include setup errors in software, or hardware problems such as noise, faulty communication links, PLLs losing their phase lock, and so on. For this reason, it may be desirable for the master to repeat the passive-to-active transition at predetermined intervals. This may allow the slaves to detect a loss of synchronization.

In one embodiment, the master periodically drives the wire active for a fixed period of time, and then returns the line to the passive state. All chips (master and slaves) sample the signal on the synchronization line in what should be the center of the pulse during which the line is active. If the line is in the passive state when it is sampled by a chip, synchronization has been lost. The chip may therefore generate an error signal or report. The chip may respond to the error signal in a number of ways. For example, it may shut down the PWM controller. Generally speaking, however, loss of synchronization is not a critical error, so the more typical response would be to alert the controller's processor and to let the processor determine an appropriate action and take steps to implement this action.

A potential improvement to the sampling feature is to provide filtering on the inputs from the synchronization wire. This may increase the reliability of the synchronization sampling in noisy environments. In one exemplary embodiment, The filtering could consist of taking three samples at regular intervals from within the window during which the synchronization line should be active and then taking a majority vote based on the three samples. A fixed long sampling interval would reduce sensitivity to noise, but asynchronous sampling in each chip would also increase the relative synchronization phase uncertainty between the chips.

An improved version of this sampling scheme might be to initially sample the passive state at a high sample rate while the synchronization line is passive and, upon detecting a transition to the active state, increasing the sample period and reading enough data for the filter to stabilize. If the majority-vote mechanism is used, at least two more samples would then be taken. If the wire is still read as active operation of the chips can be started and PWM output can be generated. Otherwise, the sample period is shortened again and a new search for a passive-to-active transition is started. This scheme allows synchronization at the high sample rate (since the search effectively synchronizes the divider from the high to low rate) and filtering with an increased sample period.

Another feature that can be incorporated using the shared synchronization wire relates to data transfer. The shared wire can be utilized by the master to broadcast data to all of the slaves. In one embodiment, the synchronization pulse can be considered the start bit of a word of data transferred in a serial format. Additional data bits can be transferred from the master to the slaves following the synchronization pulse. The transfer of the data bits is completed before the master drives the wire back to its passive state for the next synchronization pulse. The broadcast data may contain various different types of data, such as information about the internal state of each chip that might be used to synchronize and align the data streams at higher levels.

When the shared synchronization wire is utilized for data transmission as well as synchronization, the reliability of out-of-synchronization detection can be increased by keeping the wire passive for a predetermined period following the synchronization active pulse before data is transmitted. A preferred way to do this is to use pulses of identical width for both synchronization and data. For example, a data word may have two start bits (one in the active state followed by one in the passive state) which are used for synchronization, followed by a number of data bits. The reliability of the data transfer can be checked by including redundant information in the data word, such as parity or CRC bits.

This data flow sets up an isochronous scheme, where one word of data is transferred for each synchronization pulse. This means that the master must be capable of supplying the data and the slaves must be ready to accept it at this rate. The rate can be reduced by allowing the master to transmit an additional bit or specific data encoding to signify that it did not receive input data. This would allow the slaves to ignore these empty data.

The communication can be bidirectional when the master only drives the shared wire in the active state and an appropriate passive pull-up or pull-down is used to put it in the passive state (an open-drain configuration). Any device can then drive the wire active. This will cause both the master and slave(s) to lose synchronization. This mechanism can be used in response to a chip losing synchronization or detecting any other error condition for which it is desirable to communicate the error and let all chips respond simultaneously.

This mechanism can also be used to communicate to the master that all slaves are ready to start operating. In one embodiment, in the early stage of initialization, each chip drives the wire to the active state. When each chip is initialized and ready to generate output data, it releases the wire. When all chips are ready and have released the wire it will go to the passive state. When the slaves detect that the wire has gone passive, they should await generation of the start transition by the master. When the master detects that the wire is passive, it waits for a short period (to allow all of the slaves to detect the passive state and to prepare for the start transition) and then generate the start transition.

Once the controller chips are synchronized, the output phases of each of the chips should be aligned. The individual phase of the pulses of a given PWM output can then be controlled relative to this alignment. For example, it might be desirable to stagger the phases of the samples in different channels. Staggering the phases in this manner may be useful to spread out switching noise (which would otherwise be aligned), thereby reducing the amplitude and increasing frequency of the noise.

The synchronization of the controller chips can also be used to synchronize the data processing through which data is generated for the PWM blocks. Typically, the synchronization edge interval is chosen to be equal to a number of input samples to the PWM block. If this data is generated by programmable digital signal processors, they will now process and deliver data synchronously. The data communication line can be used to broadcast data that allows the processors to synchronize at even higher levels, such as converting the sample rates of multiple input data streams to a single shared output sample rate.

The protocol described above is simple and straightforward to implement. For one skilled in the art, it is possible to extend this synchronization mechanism to a full bidirectional data communication system such as a CAN bus or USB.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with general purpose processors, digital signal processors (DSPs) or other logic devices, application specific integrated circuits (ASICs), field programmable gate arrays (FPGAs), discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of the methods or algorithms described in connection with the embodiments disclosed herein may be embodied directly in hardware, in software or firmware modules executed by a processor, or in a combination thereof. A software product may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A system comprising:
    a plurality of digital pulse width modulation (PWM) controller chips; and
    a synchronization line connected to each of the plurality of chips;
    wherein one of the plurality of chips is a master, and the remainder of the plurality of chips are slaves;
    wherein the master is configured to generate a synchronization signal on the synchronization line; and
    wherein each of the slaves is configured to detect the synchronization signal and, in response to detecting the synchronization signal, to begin generating a corresponding PWM audio output signal which has a known phase relationship to PWM audio output signals generated by the other PWM controller chips.

2. The system of claim 1, wherein the plurality of digital PWM controller chips comprise separate chips in a multi-chip audio amplification system.

3. The system of claim 1, wherein the master is designated during an initialization process.

4. The system of claim 1, wherein the master and the slaves have identical circuitry.

5. The system of claim 1, wherein the synchronization signal comprises a transition from a passive state to an active state.

6. The system of claim 5, wherein the master is configured to repeat the transition at a fixed intervals.

7. The system of claim 6, wherein the master is configured to maintain the active state for a fixed period after each transition.

8. The system of claim 1, wherein the master is configured to enable transmission of non-synchronization data to the slaves via the synchronization line when the synchronization signal is not being transmitted via the synchronization line.

9. The system of claim 8, wherein the synchronization signal comprises a transition from a passive state to an active state, wherein the master is configured to maintain the active state for a fixed period, then transition from the active state to the passive state, then maintain the passive state for a fixed period, then transmit data.

10. The system of claim 1, wherein each of the slaves is configured to determine whether an error has occurred and, in response to detecting an error, to cause the master to re-synchronize the slaves.

11. The system of claim 10, wherein causing the master to re-synchronize comprises driving the synchronization line to the active state.

12. The system of claim 1, wherein the master is configured to determine whether all of the slaves are ready to begin synchronized operation before generating the synchronization signal.

13. The system of claim 12, wherein each of the slaves is configured to drive the synchronization line to an active state until the slave is ready to begin synchronized operation, and wherein the master is configured to determine that all of the slaves are ready to begin synchronized operation if the synchronization line is in a passive state.

14. The system of claim 1, wherein the output signal of each PWM controller chip has a corresponding PWM switching phase, and wherein the system is configured to stagger the PWM switching phases of the output signals of the PWM controller chips.

15. The system of claim 1, wherein the output signal of each PWM controller chip has a corresponding audio signal phase, and wherein the system is configured to align the audio signal phases of the output signals of the PWM controller chips.

16. A system comprising:
    a plurality of digital pulse width modulation (PWM) controller chips; and
    a synchronization line connected to each of the plurality of chips;
    wherein one of the plurality of chips is a master, and the remainder of the plurality of chips are slaves;
    wherein the master is configured to generate a synchronization signal on the synchronization line; and
    wherein each slave is configured to detect the synchronization signal and, in response to detecting the synchronization signal, to begin generating a corresponding PWM audio output signal which has a known phase relationship to PWM audio output signals generated by the other PWM controller chips; and
    wherein the master is configured to detect the synchronization signal and, in response to detecting the synchronization signal, to begin generating the corresponding PWM audio output signal which has a known phase relationship to PWM audio output signals generated by the slave PWM controller chips.

17. A system comprising:
    a plurality of digital pulse width modulation (PWM) controller chips; and
    a synchronization line connected to each of the plurality of chips;
    wherein one of the plurality of chips is a master, and the remainder of the plurality of chips are slaves;
    wherein the master is configured to generate a synchronization signal on the synchronization line; and
    wherein each of the slaves is configured to detect the synchronization signal and, in response to detecting the synchronization signal, to begin generating a corresponding PWM audio output signal which has a known phase relationship to PWM audio output signals generated by the other PWM controller chips;
    wherein the synchronization signal comprises a transition from a passive state to an active state;
    wherein the master is configured to repeat the transition at a fixed intervals;
    wherein the master is configured to maintain the active state for a fixed period after each transition; and
    wherein each slave is configured to sample the synchronization line during the fixed period to determine whether the synchronization line is in an active state.

18. The system of claim 17, wherein each slave is configured to take multiple samples during the fixed period and to determine whether the synchronization line is in an active state based upon a majority of the multiple samples.

19. The system of claim 17, wherein each slave is configured to filter samples of the synchronization line.

20. A system comprising:
a plurality of digital audio controller chips; and
a synchronization line connected to each of the plurality of chips;
wherein one of the plurality of chips is a master, and the remainder of the plurality of chips are slaves;
wherein the master is configured to generate a synchronization signal on the synchronization line, wherein the synchronization signal is a transition from a passive state to an active state which is repeated at fixed intervals and wherein the active state is maintained for a fixed period after each transition;
wherein each slave is configured to detect the synchronization signal by sampling the synchronization line during the fixed period to determine whether the synchronization line is in an active state, and to begin synchronized operation in response to detecting the synchronization signal;
wherein each slave is configured to detect the transition from the passive state to the active state by sampling the synchronization line at a first rate and, after detecting the transition from the passive state to the active state, to sample the synchronization line during the fixed period at a second rate which is less than the first rate.

21. A system comprising:
a plurality of digital audio controller chips; and
a synchronization line connected to each of the plurality of chips;
wherein one of the plurality of chips is a master, and the remainder of the plurality of chips are slaves;
wherein the master is configured to generate a synchronization signal on the synchronization line; and
wherein each of the slaves is configured to detect the synchronization signal and, in response to detecting the synchronization signal, to begin generating a corresponding audio output signal which has a known phase relationship to audio output signals generated by the other controller chips; and
wherein the master is configured to detect the synchronization signal and, in response to detecting the synchronization signal, to begin generating the corresponding audio output signal which has a known phase relationship to audio output signals generated by the slave controller chips.

22. A method for use with a plurality of digital audio controller chips, the method comprising:
designating one of the plurality of digital audio controller chips as a master, and the remainder of the plurality of digital audio controller chips as slaves;
at the master, generating a synchronization signal on a synchronization line that is connected to all of the plurality of digital audio controller chips; and
at each of the slaves, detecting the synchronization signal and, in response to detecting the synchronization signal, beginning to generate a corresponding audio output signal which has a known phase relationship to audio output signals generated by the other controller chips; and
at the master, detecting the synchronization signal and, in response to detecting the synchronization signal, beginning to generate the corresponding audio output signal which has a known phase relationship to audio output signals generated by the slave controller chips.

* * * * *

UNITED STATES PATENT AND TRADEMARK OFFICE
CERTIFICATE OF CORRECTION

PATENT NO.        : 7,584,009 B2
APPLICATION NO. : 10/805593
DATED             : September 1, 2009
INVENTOR(S)       : Andersen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 992 days.

Signed and Sealed this

Fourteenth Day of September, 2010

David J. Kappos
*Director of the United States Patent and Trademark Office*